United States Patent
Huang (10) Patent No.: US 9,865,526 B2
(45) Date of Patent: Jan. 9, 2018

(54) CHIP PACKAGE AND METHOD FOR FORMING THE SAME

(71) Applicant: XINTEC INC., Taoyuan (TW)

(72) Inventor: Yu-Lung Huang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 13 days.

(21) Appl. No.: 14/877,806

(22) Filed: Oct. 7, 2015

(65) Prior Publication Data

US 2016/0099195 A1 Apr. 7, 2016

Related U.S. Application Data

(60) Provisional application No. 62/060,984, filed on Oct. 7, 2014.

(51) Int. Cl.
| | |
|---|---|
| *H01L 23/48* | (2006.01) |
| *H01L 27/146* | (2006.01) |
| *H01L 25/16* | (2006.01) |
| *H01L 25/00* | (2006.01) |
| *B81B 7/00* | (2006.01) |

(Continued)

(52) U.S. Cl.
CPC ............ *H01L 23/481* (2013.01); *B81B 7/007* (2013.01); *B81C 1/00238* (2013.01); *H01L 21/76898* (2013.01); *H01L 24/03* (2013.01); *H01L 24/05* (2013.01); *H01L 24/48* (2013.01); *H01L 25/16* (2013.01); *H01L 25/50* (2013.01); *H01L 27/1469* (2013.01); *H01L 27/14634* (2013.01); *H01L 27/14636* (2013.01); *H01L 24/45* (2013.01); *H01L 24/83* (2013.01); *H01L 2224/02335* (2013.01); *H01L 2224/02372* (2013.01); *H01L 2224/02379* (2013.01); *H01L 2224/038* (2013.01); *H01L 2224/04026* (2013.01); *H01L 2224/04042* (2013.01); *H01L 2224/0556* (2013.01); *H01L 2224/05548* (2013.01); *H01L 2224/05557* (2013.01); *H01L 2224/05568* (2013.01); *H01L 2224/2919* (2013.01); *H01L 2224/32145* (2013.01); *H01L 2224/32225* (2013.01); *H01L 2224/45144* (2013.01); *H01L 2224/48225* (2013.01); *H01L 2224/48463* (2013.01); *H01L 2224/73265* (2013.01); *H01L 2224/8385* (2013.01);

(Continued)

(58) Field of Classification Search
CPC ....... H01L 24/82; H01L 24/83; H01L 23/481; H01L 2224/04042; H01L 25/041–25/043; H01L 25/047; H01L 23/49827–23/5384; H01L 21/768–21/76898
See application file for complete search history.

(56) References Cited

U.S. PATENT DOCUMENTS 8,367,477 B2 * 2/2013 Chien ................. B81C 1/00301
257/E21.509

FOREIGN PATENT DOCUMENTS

TW 201131710 9/2011

* cited by examiner

*Primary Examiner* — Jose R Diaz
(74) *Attorney, Agent, or Firm* — Liu & Liu (57) ABSTRACT

A chip package including a first substrate having an upper surface, a lower surface and a sidewall is provided. A sensing region or device region and a conducting pad are adjacent to the upper surface. A through-hole penetrates the first substrate. A redistribution layer extends from the lower surface into the through-hole and is electrically connected to the conducting pad. The redistribution layer further laterally extends from the lower surface to protrude from the sidewall. A method for forming the chip package is also provided.

22 Claims, 5 Drawing Sheets

(51) Int. Cl.
*B81C 1/00* (2006.01)
*H01L 21/768* (2006.01)
*H01L 23/00* (2006.01)

(52) U.S. Cl.
CPC .............. *H01L 2224/92147* (2013.01); *H01L 2924/10156* (2013.01); *H01L 2924/181* (2013.01)

CHIP PACKAGE AND METHOD FOR FORMING THE SAME

CROSS REFERENCE TO RELATED APPLICATIONS

This application is based on, and claims priority of U.S. Provisional Application No. 62/060,984 filed on Oct. 7, 2014, the entirety of which is incorporated by reference herein.

BACKGROUND OF THE INVENTION

Field of the Invention

The invention relates to chip package technology, and in particular to a chip package and methods for forming the same.

Description of the Related Art

The chip packaging process is an important step in the fabrication of an electronic product. Chip packages not only protect the chips therein from outer environmental contaminants, but they also provide electrical connection paths between the electronic elements inside and those outside of the chip packages.

In general, chip packages with a sensing function comprise a conducting layer formed on the upper surface of chips. The conducting layer forms external electrical connection paths of a signal contact pad. Subsequently, the conducting layer is electrically connected to a circuit board through wires.

However, in the aforementioned method, multiple layers (e.g., insulation layers) are usually deposited on sensing regions of chips. As a result, sensitivity of the sensing regions is reduced. Furthermore, the entire height of the chip packages is also limited to the height of wires. As a result, it is difficult to further decrease the size of electronic products with a sensing function.

Thus, there exists a need in the art for development of a chip package and methods for forming the same capable of mitigating or eliminating the aforementioned problems.

BRIEF SUMMARY OF THE INVENTION

An embodiment of the invention provides a chip package comprising a first substrate. The first substrate has an upper surface, a lower surface and a sidewall. A sensing region or device region and a conducting pad are adjacent to the upper surface. The chip package also comprises a through-hole penetrates the first substrate. The chip package further comprises a redistribution layer. The redistribution layer extends from the lower surface into the through-hole and is electrically connected to the conducting pad. The redistribution layer further laterally extends from the lower surface to protrude from the sidewall.

An embodiment of the invention provides a method for forming a chip package. The method comprises providing a first substrate having an upper surface, a lower surface and a sidewall, wherein a sensing region or device region and a conducting pad are adjacent to the upper surface. The method also comprises forming a through-hole penetrating the first substrate. The method further comprises forming a redistribution layer. The redistribution layer extends from the lower surface into the through-hole and is electrically connected to the conducting pad. The redistribution layer further laterally extends from the lower surface to protrude from the sidewall.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multilayer integrated circuit devices by stacking a plurality of wafers having integrated circuits or to form a system-in-package (SIP).

Figure 1A:
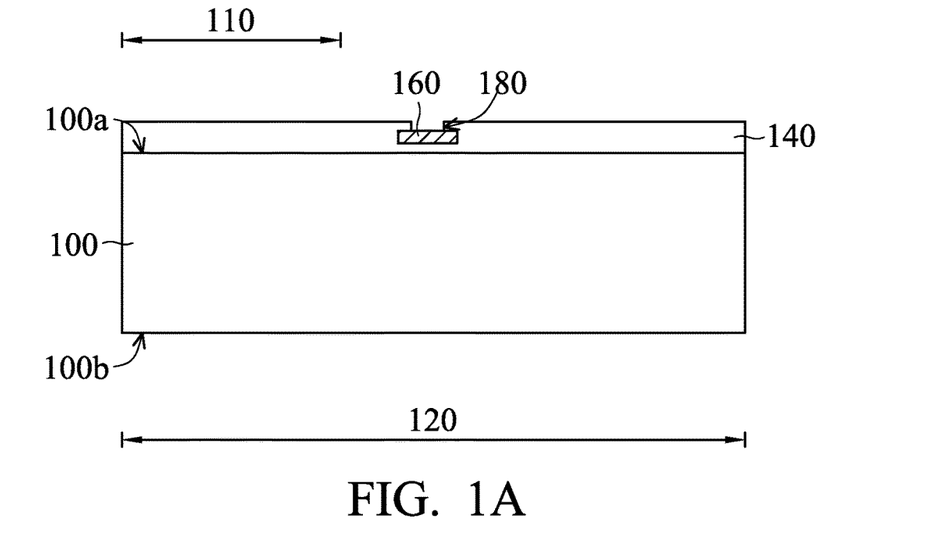
FIGS. 1A to 1H are cross-sectional views of an exemplary embodiment of a method for forming a chip package according to the invention.
Figure 1B:
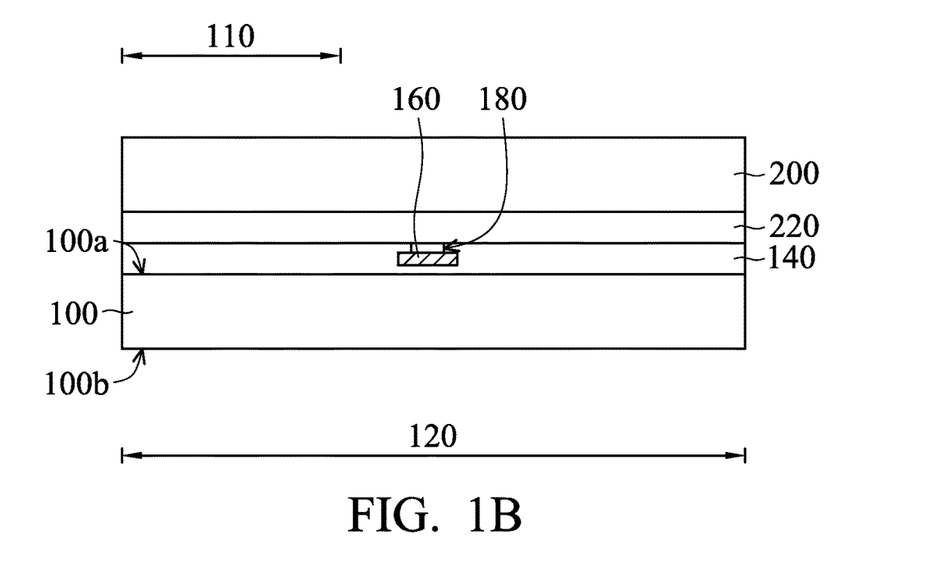
Figure 1C:
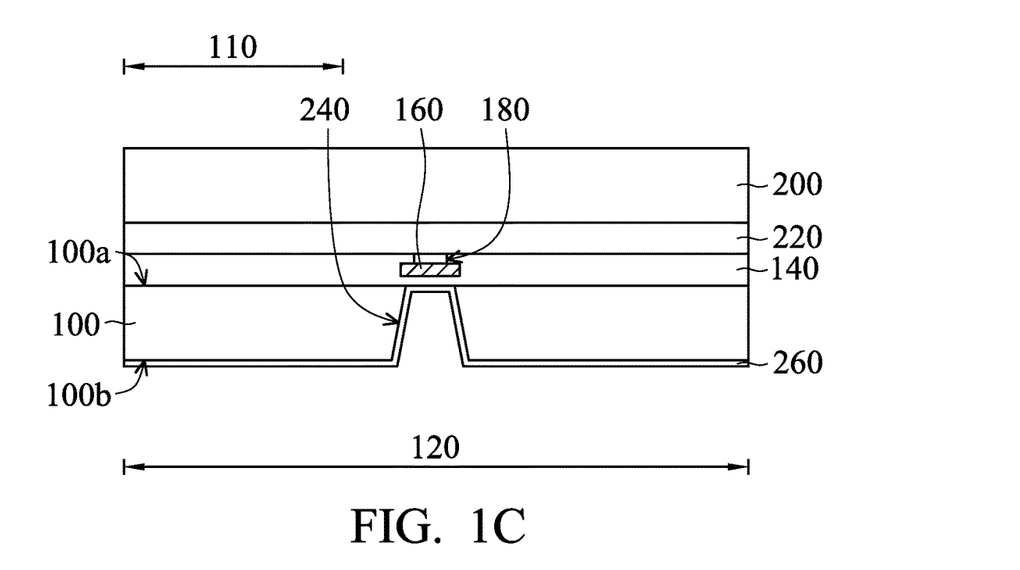
Figure 1D:
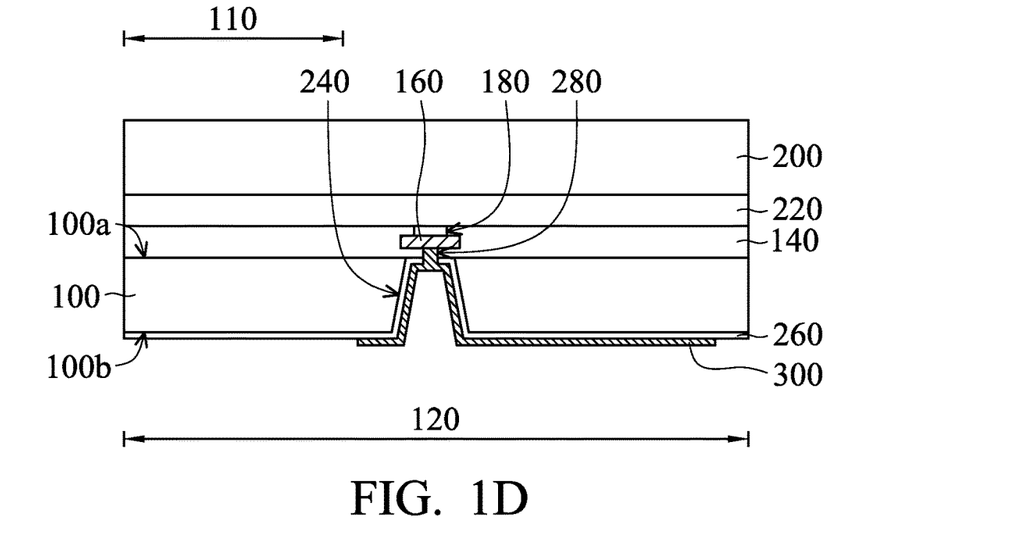
Figure 1E:
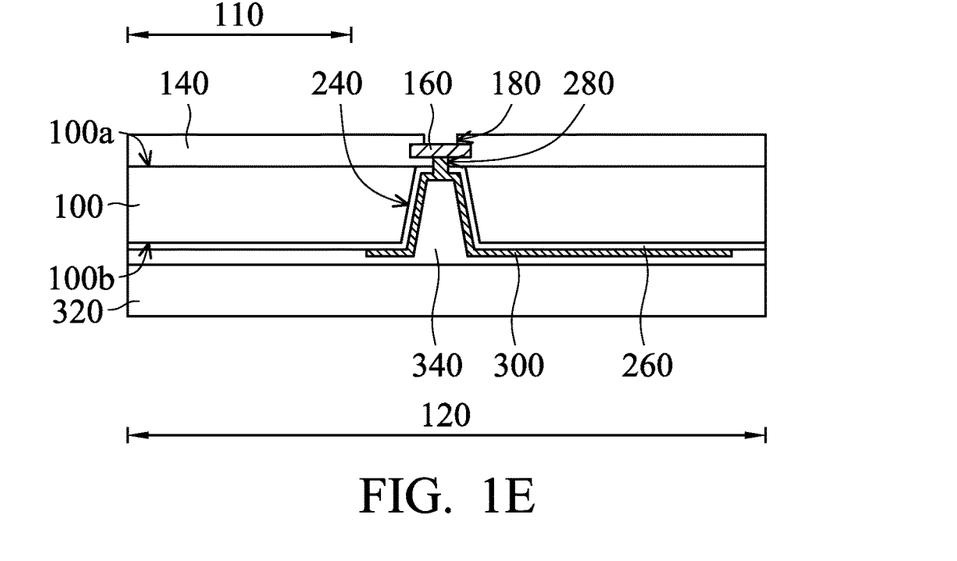
Figure 1F:
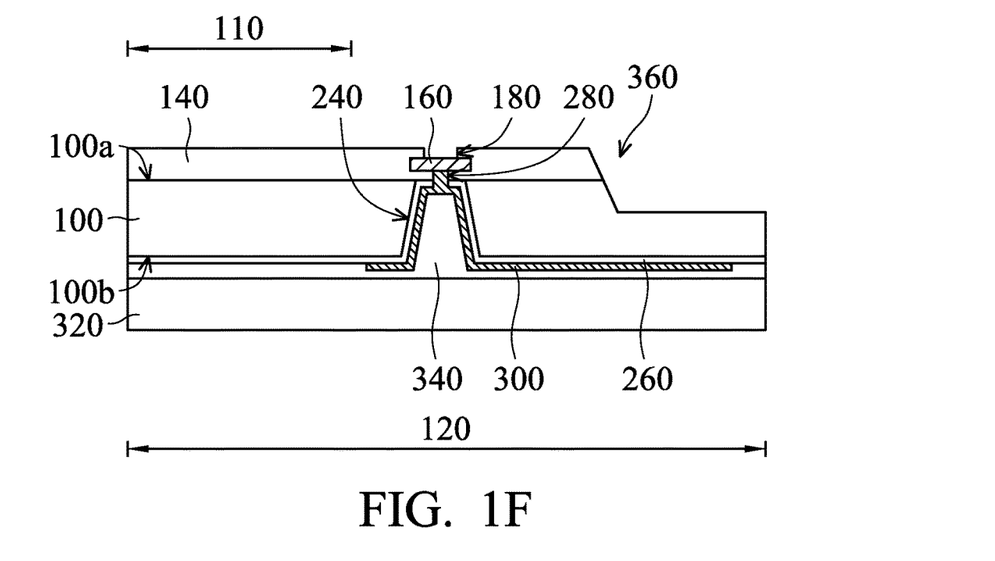
Figure 1G:
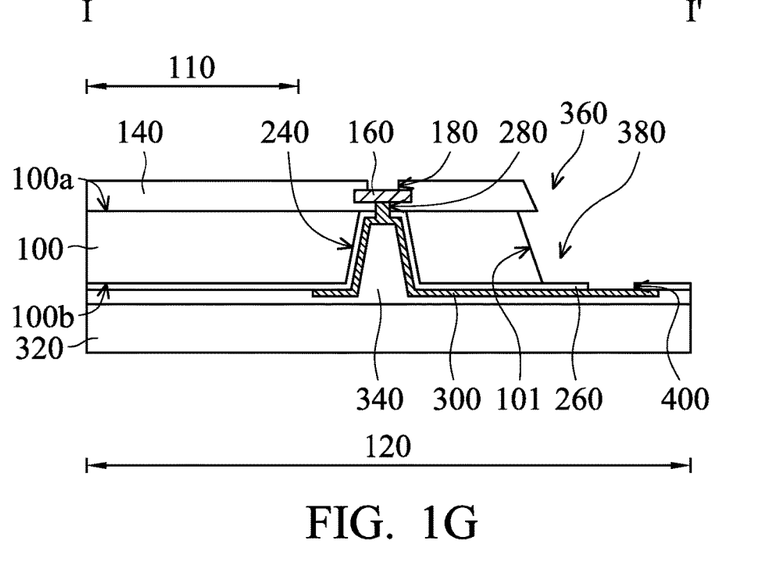
Figure 1H:
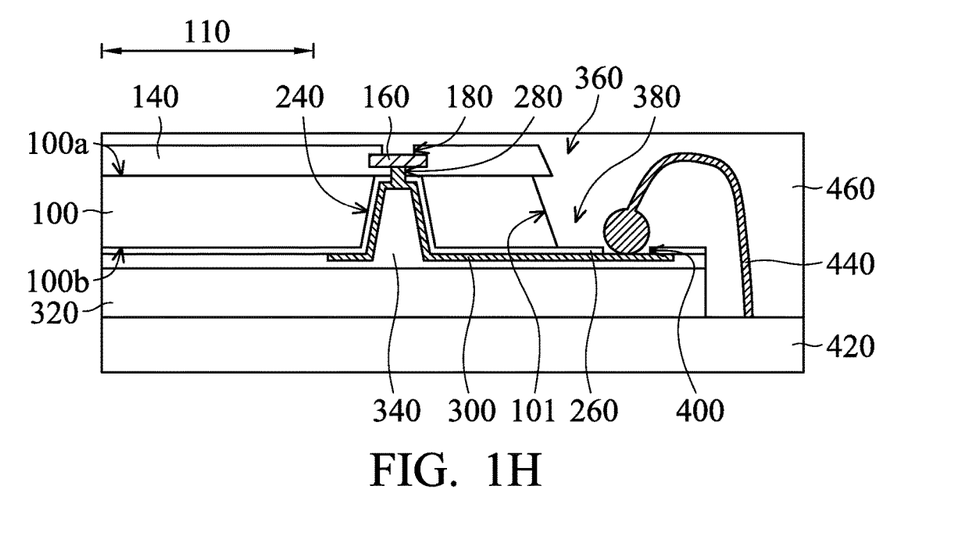

Referring to FIG. 1H, a cross-sectional view of an exemplary embodiment of a chip package according to the invention is illustrated. The chip package comprises a first substrate 100, a through-hole 240 and a redistribution layer (RDL) 300. The first substrate 100 has an upper surface 100a and a lower surface 100b, and has a sidewall 101. In one embodiment, the first substrate 100 may be a silicon substrate or another semiconductor substrate.

An insulating layer 140 is disposed on the upper surface 100a of the first substrate 100. In general, the insulating layer 140 may be made of an interlayer dielectric (ILD) layer, inter-metal dielectric (IMD) layers and a covering passivation layer. To simplify the diagram, only a single insulating layer 140 is depicted herein. In the embodiment, the insulating layer 140 may comprise an inorganic material, such as silicon oxide, silicon nitride, silicon oxynitride, metal oxide, a combination thereof, or another suitable insulating material.

In the embodiment, one or more conducting pads 160 are in the insulating layer 140 on the upper surface 100a of the first substrate 100. In one embodiment, the conducting pads 160 may be a single conducting layer or comprise multiple conducting layers. To simplify the diagram, only one conducting pad 160 comprising a single conducting layer in the insulating layer 140 is depicted herein as an example. In the embodiment, the insulating layer 140 comprises one or more openings 180 exposing the corresponding conducting pads 160. For example, when the conducting pads 160 comprise multiple conducting layers, the openings 180 expose the topmost conducting layer of the multiple conducting layers.

In the embodiment, the chip package comprises a sensing region or device region 110. The sensing region or device region 110 may be adjacent to the upper surface 100a of the first substrate 100, and may be electrically connected to the conducting pads 160 through interconnection structures (not shown).

In one embodiment, the sensing region or device region 110 may comprise an image sensing element. In another embodiment, the sensing region or device region 110 may be configured to sense biometric characteristics. For example, the sensing region or device region 110 may comprise a fingerprint-recognition element or another element for sensing biometric characteristics. In other embodiment, the sensing region or device region 110 may be configured to sense environmental characteristics. For example, the sensing region or device region 110 may comprise a temperature-sensing element, a humidity-sensing element, a pressure-sensing element, a capacitance-sensing element, or another suitable sensing element.

One or more through-holes 240 correspond to the conducting pads 160. The through-holes 240 extend from the lower surface 100b of the first substrate 100 towards the upper surface 100a. The through-holes 240 penetrate the first substrate 100 and expose the insulating layer 140 adjacent to the conducting pads 160.

An insulating layer 260 is disposed on the lower surface 100b of the first substrate 100, and extends to the sidewalls and the bottom of the through-holes 240. In the embodiment, the insulating layer 260 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

An opening 280 penetrates the insulating layer 260 on the bottom of the through-holes 240. The opening 280 extends into the insulating layer 140 to expose a portion of the conducting pad 160. For example, when the conducting pads 160 comprise multiple conducting layers, the opening 280 exposes the topmost conducting layer of the multiple conducting layers. In some embodiments, the openings 180 and 280 are disposed on two opposite side of the conducting pads 160.

The patterned redistribution layer 300 is disposed on the lower surface 100b of the first substrate 100. In some embodiments, the redistribution layer 300 conformally extends onto the sidewalls and the bottom of the through-holes 240, and fills the opening 280. As a result, the redistribution layer 300 protrudes from the upper surface 100a of the first substrate 100. In some other embodiments, the through-holes 240 and the opening 280 are filled with the redistribution layer 300.

The redistribution layer 300 may be electrically isolated from the first substrate 100 through the insulating layer 260. The redistribution layer 300 may be in direct electrical contact with or indirectly electrically connected to the exposed conducting pads 160 through the through-holes 240 and the opening 280. Accordingly, the redistribution layer 300 in the through-holes 240 and the opening 280 is also referred to as a through silicon via (TSV). In one embodiment, the redistribution layer 300 may comprise aluminum, copper, gold, platinum, nickel, tin, a combination thereof, a conductive polymer material, a conductive ceramic material (such as indium tin oxide or indium zinc oxide), or another suitable conductive material.

In the embodiment, the chip package further comprises a side recess 360 and a side recess 380 in communication with each other and located outside of the conducting pads 160. The side recess 360 penetrates the insulating layer 140. The side recess 380 extends from the bottom of the side recess 360 towards the lower surface 100b, and penetrates the first substrate 100. As a result, the insulating layer 260 on the lower surface 100b of the first substrate 100 is exposed.

In the embodiment, a sidewall of the side recess 380 forms the sidewall 101 of the first substrate 100. In one embodiment, the sidewall 101 is inclined with respect to the upper surface 100a of the first substrate 100. In other embodiments, the sidewall 101 may be substantially perpendicular to the upper surface 100a of the first substrate 100.

In the embodiment, the size of the side recess 380 is greater than the size of the side recess 360. As a result, the insulating layer 140 laterally extends from the upper surface 100a of the first substrate 100 and protrudes from the sidewall 101 of the first substrate 100. In the embodiment, both the insulating layer 260 and the redistribution layer 300 on the lower surface 100b laterally extend from the lower surface 100b and protrude from the sidewall 101. Furthermore, the insulating layer 260 has one or more openings 400 correspondingly exposing the redistribution layer 300 protruding from the sidewall 101 of the first substrate 100.

Figure 2:
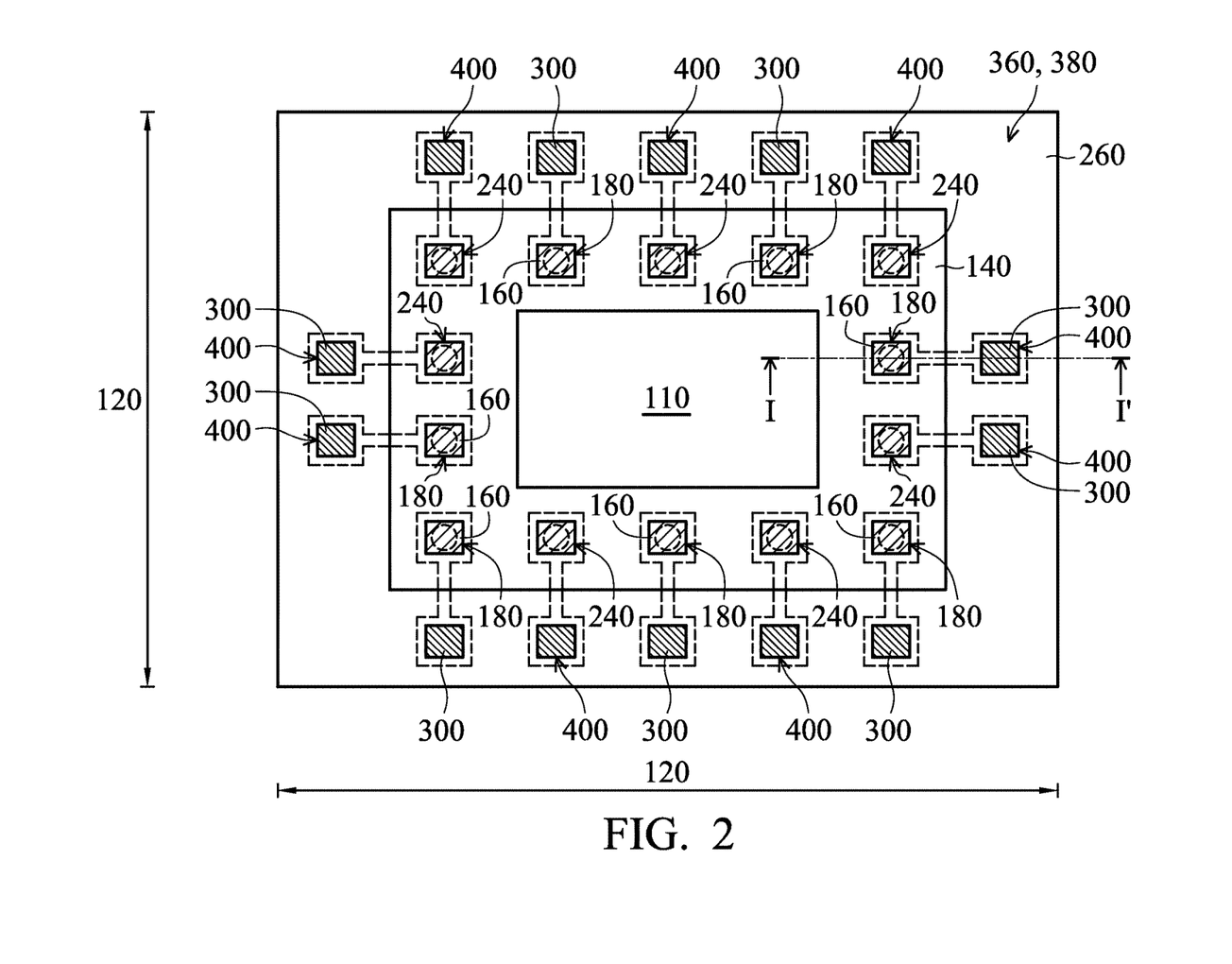
FIG. 2 is a top view of an exemplary embodiment of a chip package according to the invention.

Referring to FIGS. 1H and 2, a cross-sectional view and a top view of an exemplary embodiment of a chip package according to the invention are illustrated, respectively. In the embodiment, the side recess 360 and the side recess 380 extend along the periphery of the first substrate 100. As a result, the insulating layer 260 outside of the side edges of the first substrate 100 is exposed.

In one embodiment, the side recess 360 and the side recess 380 extend across the entire length of four side edges of the first substrate 100. In another embodiment, the side recess 360 and the side recess 380 laterally extend along the partial or full length of only one side edge of the first substrate 100. In yet another embodiment, the side recess 360 and the side recess 380 span the entire length of one side edge of the first substrate 100, and further laterally extend along the partial or full length of another adjacent side edge. In other embodiments, the side recess 360 and the side recess 380 span the entire length of one side edge of the first substrate 100, and further laterally extend along the partial or full length of two adjacent side edges. It should be realized that although not shown in the figures, the actual number and position of the side recesses are determined by design requirements as long as the side recesses laterally extend along the partial or full length of at least one side edge of the first substrate 100.

Furthermore, as shown in FIG. 2, the insulating layer 140 has multiple openings 180 exposing the corresponding conducting pads 160. The through-holes 240 are located below the corresponding conducting pads 160. The redistribution layer 300 laterally extends from the conducting pads 160 and the through-holes 240, and extends below the insulating layer 260. The profile of the redistribution layer 300 is illustrated as dashed lines for a better understanding of the structure. The insulating layer 260 has multiple openings 400 exposing the corresponding redistribution layer 300. It should be realized that the number, shape and position of the elements shown in FIG. 2 are determined by design requirements, and they are not limited thereto.

A second substrate 320 may be disposed on the insulating layer 260 on the lower surface 100b through a bonding layer 340. In the embodiment, the second substrate 320 may comprise glass, silicon or another material suitable for a carrier substrate. In some embodiments, the second substrate 320 may comprise application-specific integrated circuits (ASIC), a signal processor or another electronic components.

In some embodiment, the bonding layer 340 substantially fully fills the through-holes 240. In some other embodiments, the through-holes 240 may be partially filled with the bonding layer 340 or free from being filled with the bonding layer 340. In the embodiment, the bonding layer 340 may comprise adhesive glue, oxides, oxides and metal, polymer, or another suitable bonding material.

An external device 420 may be attached to the second substrate 320 through an adhesive layer (not shown). In the embodiment, the external device 420 may be a circuit board, a chip or an interposer.

One or more external conducting structures 440 are disposed in the corresponding openings 400 to be electrically connected to the corresponding conducting pads 160 through the exposed redistribution layer 300. Furthermore, the external conducting structures 440 extend onto the external device 420 to electrically connect the conducting pads 160 and the external device 420. In other embodiments, the external conducting structures 440 may be disposed in the openings 180 of the insulating layer 140 to be electrically connected to the corresponding conducting pads 160. It should be realized that the actual number and position of the external conducting structures 440 are determined by design requirements.

Although not shown in the figures, multiple external conducting structures 440 are optionally disposed in the openings 180 and/or 400. In one embodiment, the external conducting structures 440 may be formed of a bonding ball within the openings 400 or 180 and a wire extending from the bonding ball to the external device 420. Moreover, the external conducting structure 440 may comprise gold or another suitable conductive material.

In one embodiment, the highest portion of the external conducting structures 440 is lower than the upper surface 100 of the first substrate 100a. In other embodiments, the highest portion of the external conducting structures 440 may protrude from the upper surface 100 of the first substrate 100a.

An encapsulation layer 460 may optionally cover the external conducting structures 440 and a portion of the first substrate 100, or further extend onto the upper surface 100a of the first substrate 100. As a result, a flat contact surface is formed on the sensing region or device region 110. Forming a flat contact surface on the sensing region or device region 110 by the encapsulation layer 460 is depicted herein as an example. In the embodiment, the encapsulation layer 460 may be formed of molding materials or sealing materials.

In general, sensing regions or device regions and conducting pads of chips are located on an active surface of the chips. If external electrical connection paths of the chips are formed on the active surface, multiple layers (e.g., insulation layers) need to be deposited on the active surface. As a result, sensitivity of the sensing regions or device regions on the active surface is reduced.

According to the aforementioned embodiments, the redistribution layer 300 is electrically connected to the conducting pads 160 through the through-holes 240 within the first substrate 100. The redistribution layer 300 laterally extends from the lower surface 100b of the first substrate 100 to protrude from the sidewall 101 of the first substrate 100. As a result, the external electrical connection paths of the first substrate 100 extend from the inner of the first substrate 100 through the lower surface 100b to the outer of the first substrate 100. Therefore, the reduction of sensitivity or light transmittance of the sensing region or device region 110, which results from too many layers on the upper surface 100a of the first substrate 100, can be avoided.

Furthermore, since the redistribution layer laterally protrudes from the sidewall 101, the external conducting structures (e.g., wires) 440 that are configured to electrically connect the conducting pads 160 and the external device 420 to each other can be disposed outside of the first substrate 100, rather than on the upper surface 100a. As a result, the highest portion of the external conducting structures 440 can be lower than the upper surface 100a. Therefore, the entire height of the chip packages can be reduced, thereby decreasing the size of electronic products with sensing functions.

An exemplary embodiment of a method for forming a chip package according to the invention is illustrated in FIGS. 1A to 1H and FIG. 2, in which FIGS. 1A to 1H and FIG. 2 are cross-sectional views and a top view of an exemplary embodiment of a chip package according to the invention, respectively.

Referring to FIG. 1A, a first substrate 100 is provided. The first substrate 100 has an upper surface 100a and a lower surface 100b, and comprises multiple chip regions. To simplify the diagram, only one partial chip region 120 is depicted herein. In one embodiment, the first substrate 100 may be a silicon substrate or another semiconductor substrate. In another embodiment, the first substrate 100 may be a silicon wafer so as to facilitate the wafer-level packaging process.

In the embodiment, there is an insulating layer 140 on the upper surface 100a of the first substrate 100. In general, the insulating layer 140 may be made of an ILD layer, IMD layers and a covering passivation layer. To simplify the diagram, only a single insulating layer 140 is depicted herein. In the embodiment, the insulating layer 140 may comprise an inorganic material, such as silicon oxide, silicon nitride, silicon oxynitride, metal oxide, a combination thereof, or another suitable insulating material.

In the embodiment, one or more conducting pads 160 are in the insulating layer 140 in each of the chip regions 120. The conducting pads 160 are adjacent to the upper surface 100a of the first substrate 100. In one embodiment, the conducting pads 160 may be a single conducting layer or comprise multiple conducting layers. To simplify the diagram, only a single conducting layer is depicted herein as an example. In the embodiment, the insulating layer 140 comprises one or more openings 180 exposing the corresponding conducting pads 160. For example, when the conducting pads 160 comprise multiple conducting layers, the openings 180 expose the topmost conducting layer of the multiple conducting layers.

Furthermore, the chip package comprises a sensing region or device region 110. The sensing region or device region 110 may be adjacent to the upper surface 100a of the first substrate 100, and may be electrically connected to the conducting pads 160 through interconnection structures (not shown).

In one embodiment, the sensing region or device region 110 may comprise an image sensing element. In another embodiment, the sensing region or device region 110 may be configured to sense biometric characteristics. For example, the sensing region or device region 110 may comprise a fingerprint-recognition element or another element for sensing biometric characteristics. In other embodiment, the sensing region or device region 110 may be configured to sense environmental characteristics. For example, the sensing region or device region 110 may comprise a temperature-sensing element, a humidity-sensing element, a pressure-sensing element, a capacitance-sensing element, or another suitable sensing element.

In the embodiment, the first substrate 100 may be fabricated by sequentially performing a front-end process (for example, a transistor is formed in the first substrate 100 in the sensing region or device region 110) and a back-end process (for example, the insulating layer 140, the interconnection structures, and the conducting pads 160 are formed) of a semiconductor device. In other words, the following method for forming a chip package proceeds subsequently packaging processes to the first substrate after the back-end process is finished.

Referring to FIG. 1B, a temporary substrate 200 may be attached to the insulating layer 140 on the upper surface 100a through an adhesive layer (such as glue) 220. In the embodiment, the temporary substrate 200 may be glass or another suitable substrate material. Subsequently, a thinning process (such as an etching process, a milling process, a grinding process or a polishing process) using the temporary substrate 200 as a carrier substrate is performed on the lower surface 100b of the first substrate 100 to reduce the thickness of the first substrate 100.

Referring to FIG. 1C, one or more through-holes 240 may be formed in the first substrate 100 in each chip region 120 by a lithography process and an etching process (such as a dry etching process, a wet etching process, a plasma etching process, a reactive ion etching process, or another suitable process). The through-holes 240 correspond to the conducting pads 160, and extend from the lower surface 100b of the first substrate 100 towards the upper surface 100a. The through-holes 240 penetrate the first substrate 100 and expose the insulating layer 140 adjacent to the conducting pads 160.

Next, an insulating layer 260 may be conformally formed on the lower surface 100b of the first substrate 100 by a deposition process (such as a coating process, a physical vapor deposition process, a chemical vapor deposition process or another suitable process). The insulating layer 260 conformally extends to the sidewalls and the bottom of the through-holes 240. In the embodiment, the insulating layer 260 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Referring to FIG. 1D, the insulating layer 260 on the bottom of the through-holes 240 and the insulating layer 140 adjacent to the conducting pads 160 may be removed to form openings 280 by a lithography process and an etching process (such as a dry etching process, a wet etching process, a plasma etching process, a reactive ion etching process, or another suitable process). The openings 280 expose a portion of the conducting pads 160. For example, when the conducting pads 160 comprise multiple conducting layers, the openings 280 expose the topmost conducting layer of the multiple conducting layers. In some embodiments, the openings 180 and 280 are disposed on two opposite side of the conducting pads 160.

Next, a patterned redistribution layer 300 may be formed on the insulating layer 260 by a deposition process (such as a coating process, a physical vapor deposition process, a chemical vapor deposition process, an electroplating process, an electroless plating process or another suitable process) and lithography and etching processes.

The redistribution layer 300 is formed on the lower surface 100b of the first substrate 100. In some embodiments, the redistribution layer 300 conformally extends onto the sidewalls and the bottom of the through-holes 240, and fills the opening 280. As a result, the redistribution layer 300 protrudes from the upper surface 100a of the first substrate 100. In some other embodiments, both the through-holes 240 and the opening 280 are filled with the redistribution layer 300. The redistribution layer 300 may be electrically isolated from the first substrate 100 through the insulating layer 260. The redistribution layer 300 may be in direct electrical contact with or indirectly electrically connected to the exposed conducting pads 160 through the through-holes 240 and the opening 280. Accordingly, the redistribution layer 300 in the through-holes 240 and the opening 280 is also referred to as a TSV. In one embodiment, the redistribution layer 300 may comprise aluminum, copper, gold, platinum, nickel, tin, a combination thereof, a conductive polymer material, a conductive ceramic material (such as indium tin oxide or indium zinc oxide), or another suitable conductive material.

Referring to FIG. 1E, a second substrate 320 may be disposed on the insulating layer 260 on the lower surface 100b through a bonding layer 340 to serve as a permanent carrier substrate. In the embodiment, the second substrate 320 may comprise glass, silicon or another material suitable for a carrier substrate. In some embodiment, the bonding layer 340 substantially fully fills the through-holes 240. In some other embodiments, the through-holes 240 may be partially filled with the bonding layer 340 or free from being filled with the bonding layer 340. In the embodiment, the bonding layer 340 may comprise adhesive glue, oxides, oxides and metal, polymer, or another suitable bonding material. After providing the second substrate 320, the adhesive layer 220 and the temporary substrate 200 may be removed.

Referring to FIG. 1F, one or more side recesses 360 may be formed in each of the chip regions 120 by a notching process, lithography and etching processes or other suitable processes. The side recesses 360 are positioned outside of the conducting pads 160. The side recesses 360 penetrate the insulating layer 140, and extend into the first substrate 100. For example, the portions of the insulating layer 140 and the first substrate 100, which correspond to the chip regions 120 and scribed lines (not shown) between the adjacent chip regions 120, are removed.

Referring to FIG. 1G, one or more side recesses 380 may be formed in each of the chip regions 120 by a lithography process and an etching process (such as a dry etching process, a wet etching process, a plasma etching process, a reactive ion etching process, or another suitable process) using the insulating layer 140 on the upper surface 100a as a hard mask. In some other embodiments, a patterned photoresist layer may be additionally formed to perform the aforementioned lithography and etching processes.

In the embodiment, the side recesses 380 are positioned outside of the conducting pads 160 and in communication with the side recesses 360. The side recesses 380 extend towards the lower surface 100b, and penetrate the first substrate 100. As a result, the insulating layer 260 on the lower surface 100b of the first substrate 100 is exposed. For example, the portions of the first substrate 100, which correspond to the chip regions 120 and scribed lines (not shown) between the adjacent chip regions 120, are removed. As a result, the portions of the first substrate 100 between the adjacent chip regions 120 are partially or fully separated from each other.

In the embodiment, a sidewall of the side recess 380 forms a sidewall 101 of the first substrate 100. In one embodiment, the sidewall 101 is inclined with respect to the upper surface 100a of the first substrate 100. In other embodiments, the sidewall 101 may be substantially perpendicular to the upper surface 100a of the first substrate 100.

In the embodiment, the size of the side recesses 380 is greater than the size of the side recesses 360. As a result, the insulating layer 140 laterally extends from the upper surface 100a of the first substrate 100 and protrudes from the sidewall 101 of the first substrate 100. In the embodiment, both the insulating layer 260 and the redistribution layer 300 on the lower surface 100b laterally extend from the lower surface 100b and protrude from the sidewall 101.

In general, if a redistribution layer extends from an upper surface of a substrate along a sidewall of the substrate, the substrate needs to have an inclined sidewall so that the redistribution layer can be successfully formed from the upper surface along the sidewall. In contract, the redistribution layer in the embodiments extends from the inner of the first substrate through the lower surface and laterally protrudes from the sidewall of the first substrate without being formed on the upper surface and the sidewalls of the first substrate. Accordingly, no matter the sidewalls of the first substrate are inclined or vertical, the formation of the redistribution layer is not affected.

Furthermore, the redistribution layer in the embodiments is not formed on the upper surface and the sidewalls of the first substrate. Accordingly, although the insulating layer laterally protrudes from the sidewall of the first substrate, the formation of the redistribution layer is not affected by the protruding portion of the insulating layer. Therefore, there is no need to perform an additional process to remove the protruding portion of the insulating layer.

Next, portions of the insulating layer 260 protruding from the sidewall 101 are removed by a lithography process and an etching process (such as a dry etching process, a wet etching process, a plasma etching process, a reactive ion etching process, or another suitable process). As a result, one or more openings 400 are formed. The openings 400 expose portions of the redistribution layer 300 protruding from the sidewall 101. The openings 400 and the first substrate 100 are positioned side by side.

Referring to FIGS. 1H and 2, in which FIG. 1G is a cross-sectional view taken along the line I-I' in FIG. 2. In the embodiment, the side recesses 360 and the side recesses 380 extend along the periphery of the first substrate 100 and span the entire length of four side edges. As a result, the insulating layer 260 below the four side edges of the first substrate 100 is exposed. In another embodiment, the side recesses 360 and the side recesses 380 may laterally extend along the partial or full length of only one side edge of the first substrate 100. In yet another embodiment, the side recesses 360 and the side recesses 380 may span the entire length of one side edge of the first substrate 100, and further laterally extend along the partial or full length of another adjacent side edge. In other embodiments, the side recesses 360 and the side recesses 380 may span the entire length of one side edge of the first substrate 100, and further laterally extend along the partial or full length of two adjacent side edges.

In the embodiment, when the side recesses 360 are formed by a notching process and the side recesses 380 are formed by lithography and etching process, the side recesses 360 and the side recesses 380 extend along the full length of a side edge of the first substrate 100. When the side recesses 360 and the side recesses 380 are formed by lithography and etching process, the side recesses 360 and the side recesses 380 may extend along the partial or full length of a side edge of the first substrate 100. It should be realized that although not shown in the figures, the actual number and position of the side recesses are determined by design requirements as long as the side recesses laterally extend along the partial or full length of at least one side edge of the first substrate 100.

Furthermore, as shown in FIG. 2, multiple openings 180 are formed in the insulating layer 140 to expose the corresponding conducting pads 160. The through-holes 240 are formed below the corresponding conducting pads 160. The redistribution layer 300 laterally extends from the conducting pads 160 and the through-holes 240, and extends below the insulating layer 260. The profile of the redistribution layer 300 is illustrated as dashed lines for a better understanding of the structure. Multiple openings 400 are formed in the insulating layer 260 to expose the corresponding redistribution layer 300. It should be realized that the number, shape and position of the elements shown in FIG. 2 are determined by design requirements, and they are not limited thereto.

Next, referring to FIG. 1H, a dicing process is performed on the insulating layer 260 and the second substrate 320 along the scribed lines (not shown) between the adjacent chip regions 120. As a result, multiple separated chip packages are formed.

Afterwards, an external device 420 may be attached onto the second substrate 320 of separated chip packages through an adhesive layer (not shown). In the embodiment, the external device 420 may be a circuit board, a chip or an interposer.

Subsequently, one or more external conducting structures 440 are formed in the corresponding openings 400 and extend onto the external device 420 by a wire bonding process. As a result, the external conducting structures 440 are electrically connected to the corresponding conducting pads 160 through the exposed redistribution layer 300. Furthermore, the external conducting structures 440 electrically connect the conducting pads 160 to the external device 420. In other embodiments, the external conducting structures 440 may be formed in the openings 180 of the insulating layer 140 to be electrically connected to the corresponding conducting pads 160. It should be realized that the actual number and position of the external conducting structures 440 are determined by design requirements.

Although not shown in the figures, multiple external conducting structures 440 are optionally formed in the openings 180 and/or 400. In one embodiment, the external conducting structures 440 may be formed of a bonding ball within the openings 400 or 180 and a wire extending from the bonding ball to the external device 420. Moreover, the external conducting structure 440 may comprise gold or another suitable conductive material.

In one embodiment, the highest portion of the external conducting structures 440 is lower than the upper surface 100 of the first substrate 100a. In other embodiments, the highest portion of the external conducting structures 440 may protrude from the upper surface 100 of the first substrate 100a.

Afterwards, an optional encapsulation layer 460 may be formed on the external device 420 and the separated chip package by a molding process or a deposition process (such as a coating process, a physical vapor deposition process, a chemical vapor deposition process or another suitable process). The encapsulation layer 460 may cover the external conducting structures 440 and a portion of the first substrate 100, or further extend onto the upper surface 100a of the first substrate 100. As a result, a flat contact surface is formed on the sensing region or device region 110. Forming a flat contact surface on the sensing region or device region 110 by the encapsulation layer 460 is depicted herein as an example. In the embodiment, the encapsulation layer 460 may be formed of molding materials or sealing materials.

According to the aforementioned embodiments, a TSV is formed in a chip to be electrically connected to conducting pads. The redistribution layer in the TSV laterally extends from a non-active surface of the chip and protrudes from a sidewall of the chip. As a result, external electrical connection paths of the chip extend from the inner of the chip through the non-active surface of the chip to the outer of the chip. Therefore, the reduction of sensitivity as a result of excessive layers on an active surface of the chip can be avoided. For example, when a chip package comprises a photosensitive element, incident light towards the sensing region or device region has increased transmittance according to the aforementioned embodiments. Accordingly, the sensitivity of the chip package is improved.

Furthermore, the redistribution layer in the embodiments laterally protrudes from the sidewall of the chip. As a result, external conducting structures (e.g., wires) that are configured to electrically connect the chips and an external device to each other can be formed outside of the chip, rather than on the active surface of the chip. Therefore, the size of the chip packages is reduced even further.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a first substrate having an upper surface, a lower surface and a sidewall;
   a sensing region or device region and a conducting pad adjacent to the upper surface;
   a through-hole penetrating the first substrate;
   a redistribution layer extending from the lower surface into the through-hole and electrically connected to the conducting pad, wherein the redistribution layer further laterally extends from the lower surface to protrude from the sidewall; and
   a second substrate, wherein the lower surface of the first substrate is disposed on the second substrate through a bonding layer.

2. The chip package as claimed in claim 1, further comprising an insulating layer disposed between the first substrate and the redistribution layer, wherein the insulating layer laterally extends from the lower surface to protrude from the sidewall, and wherein the insulating layer has an opening exposing the redistribution layer protruding from the sidewall.

3. The chip package as claimed in claim 2, further comprising an external conducting structure disposed in the opening and electrically connected to the redistribution layer protruding from the sidewall.

4. The chip package as claimed in claim 1, further comprising an insulating layer, wherein the conducting pad is located in the insulating layer, and wherein the insulating layer laterally extends from the upper surface to protrude from the sidewall.

5. The chip package as claimed in claim 1, wherein the bonding layer is filled into the through-hole.

6. The chip package as claimed in claim 1, wherein the second substrate comprises application-specific integrated circuits or a signal processor.

7. The chip package as claimed in claim 1, wherein the sensing region or device region comprises an element configured to sense images, biometrics or environmental characteristics.

8. The chip package as claimed in claim 1, further comprising a side recess, wherein a sidewall of the side recess forms the sidewall of the first substrate, and wherein the side recess laterally extends along at least a partial length of a side edge of the first substrate.

9. The chip package as claimed in claim 8, wherein the side recess laterally extends along at least an entire length of the side edge.

10. The chip package as claimed in claim 9, wherein the side recess further extends along at least a partial length of at least one another side edge of the first substrate adjacent to the side edge.

11. The chip package as claimed in claim 1, wherein the redistribution layer further extends to protrude from the upper surface and be electrically connected to the conducting pad.

12. A method for forming a chip package, comprising:
   providing a first substrate having an upper surface, a lower surface and a sidewall, wherein a sensing region or device region and a conducting pad are adjacent to the upper surface;
   forming a through-hole penetrating the first substrate;
   forming a redistribution layer extending from the lower surface into the through-hole and electrically connected to the conducting pad, wherein the redistribution layer further laterally extends from the lower surface to protrude from the sidewall; and disposing the lower surface of the first substrate on a second substrate through a bonding layer.

13. The method as claimed in claim 12, further comprising forming an insulating layer between the first substrate and the redistribution layer, wherein the insulating layer laterally extends from the lower surface to protrude from the sidewall, and wherein the insulating layer has an opening exposing the redistribution layer protruding from the sidewall.

14. The method as claimed in claim 13, further comprising forming an external conducting structure in the opening, wherein the external conducting structure is electrically connected to the redistribution layer protruding from the sidewall.

15. The method as claimed in claim 12, wherein the conducting pad is located in an insulating layer, and wherein the insulating layer laterally extends from the upper surface to protrude from the sidewall.

16. The method as claimed in claim 12, wherein the bonding layer is filled into the through-hole.

17. The method as claimed in claim 12, wherein the second substrate comprises application-specific integrated circuits or a signal processor.

18. The method as claimed in claim 12, wherein the sensing region or device region comprises an element configured to sense images, biometrics or environmental characteristics.

19. The method as claimed in claim 12, further comprising forming a side recess, wherein a sidewall of the side recess forms the sidewall of the first substrate, and wherein the side recess laterally extends along at least a partial length of a side edge of the first substrate.

20. The method as claimed in claim 19, wherein the side recess laterally extends along at least an entire length of the side edge.

21. The method as claimed in claim 20, wherein the side recess further extends along at least a partial length of at least one another side edge of the first substrate adjacent to the side edge.

22. The method as claimed in claim 12, wherein the redistribution layer further extends to protrude from the upper surface and be electrically connected to the conducting pad.

* * * * *